(12) United States Patent  
Ikeda (10) Patent No.: US 7,578,946 B2  
(45) Date of Patent: Aug. 25, 2009

(54) PLASMA PROCESSING SYSTEM AND PLASMA PROCESSING METHOD

(75) Inventor: Taro Ikeda, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/635,651

(22) Filed: Aug. 7, 2003

(65) Prior Publication Data

US 2004/0050329 A1    Mar. 18, 2004

Related U.S. Application Data

(63) Continuation-in-part of application No. PCT/JP02/01111, filed on Feb. 8, 2002, now abandoned.

(30) Foreign Application Priority Data

Feb. 8, 2001    (JP)    ............................. 2001-032711

(51) Int. Cl.  
  *B44C 1/22*    (2006.01)  
  *C03C 15/00*    (2006.01)  
  *C03C 25/68*    (2006.01)  
  *C23F 3/00*    (2006.01)

(52) U.S. Cl. ............................. 216/68; 216/67; 216/71; 156/345.48

(58) Field of Classification Search ................. 438/715, 438/723; 216/68, 71, 67; 156/345.48; 118/723 I, 118/723 IR, 723 AN, 723 MP  
See application file for complete search history.

(56) References Cited

U.S. PATENT DOCUMENTS 5,460,689 A * 10/1995 Raaijmakers et al. ....... 438/713

(Continued)

FOREIGN PATENT DOCUMENTS

EP    0488307 A    6/1992

(Continued)

OTHER PUBLICATIONS

International Preliminary Examination Report (PCT/IPEA/409) (translated) issued for PCT/JP02/01111.

(Continued)

*Primary Examiner*—Roberts Culbert  
(74) *Attorney, Agent, or Firm*—Smith, Gambrell & Russell, LLP (57) ABSTRACT

An object of the present invention is to provide a plasma processing system and a plasma processing method which use inductive coupled plasmas but do not cause disadvantages due to slant electric fields immediately after plasmas have been ignited. An other object of the present invention is to provide a plasma processing system and a plasma processing method which use inductive coupled plasmas and include a Faraday shield to thereby remove slant magnetic fields so as to ensure the ignition of plasmas.

The plasma processing system comprises a chamber 31, a bell jar 32, a coil 42 disposed on the outside of the belljar 32, a Faraday shield 44 disposed between the belljar 32 and the coil 42, a susceptor 33, a conducting member 49 disposed upper of the belljar 32, a first high-frequency electric power source for the coil 42 to generate induced electromagnetic fields, and a second high-frequency electric power source 34 for generating electric fields between the susceptor 33 and the conducting member 49.

26 Claims, 5 Drawing Sheets

U.S. PATENT DOCUMENTS

| | | | |
|---|---|---|---|
| 6,020,686 | A | 2/2000 | Ye et al. |
| 6,068,784 | A | 5/2000 | Collins et al. |
| 6,077,384 | A | 6/2000 | Collins et al. |
| 6,136,139 | A | 10/2000 | Ishii et al. |
| 6,220,201 | B1 * | 4/2001 | Nowak et al. ............. 118/723 I |
| 6,447,636 | B1 * | 9/2002 | Qian et al. ............. 156/345.48 |
| 6,488,807 | B1 | 12/2002 | Collins et al. |
| 6,652,711 | B2 * | 11/2003 | Brcka et al. ............. 156/345.48 |
| 6,776,170 | B2 * | 8/2004 | Liu ............................ 134/1.1 |

FOREIGN PATENT DOCUMENTS

| | | | |
|---|---|---|---|
| EP | 0 520 519 | A1 | 12/1992 |
| EP | 641 013 | | 3/1995 |
| EP | 685 873 | | 12/1995 |
| EP | 0817237 | A | 1/1998 |
| JP | 05-206072 | | 8/1993 |
| JP | 10-275694 | | 10/1998 |
| WO | WO/01/13403 | | 2/2001 |

OTHER PUBLICATIONS

Notification of Transmittal of Translation of the International Preliminary Examination Report (PCT/IB/338) issued for PCT/JP02/01111.

PCT Publication WO 02/063667

Form PCT/IB/301 (Notification of Receipt of Record) (PCT/JP02/01111).

Form PCT/IB/308 (Notice Informing The Applicant of the Communication of the International Application to the Designated Offices) (PCT/JP02/01111).

International Search Report for PCT/ JP02/01111.

Notification Concerning Submission or Transmittal of Priority Document (PCT/IB/304)(PCT/JP02/01111).

Form PCT/IPEA/409 International Preliminary Examination Report for PCT/ JP02/01111 (in Japanese).

Demand for International Preliminary Examination Report (Form PCT/IPEA/401) (PCT/JP02/01111) (in Japanese).

* cited by examiner

PLASMA PROCESSING SYSTEM AND PLASMA PROCESSING METHOD

CROSS REFERENCE TO RELATED APPLICATIONS

This is a continuation-in-part of Application PCT/JP02/01111, filed Feb. 8, 2002, and published in Japanese, now abandoned.

BACKGROUND OF THE INVENTION

1. Field of the Invention

The present invention relates to a plasma processing system and a plasma processing method.

2. Related Background Art

In semiconductor fabrication processes, plasma processing systems which make required processing on semiconductor wafers (herein after simply called a wafer), objects-to-be-processed with plasmas are used.

Such plasma processing systems include those using inductive coupled plasmas (ICP) and those using capacitive coupled plasmas (CCP). The inductive coupled plasmas, which have higher plasma density than the capacitive coupled plasmas and have 10-20 V bias voltages which are lower than 100-200 V bias voltages of the capacitive coupled plasmas, can make highly efficient processing on wafers with little damage.

Figure 5A:
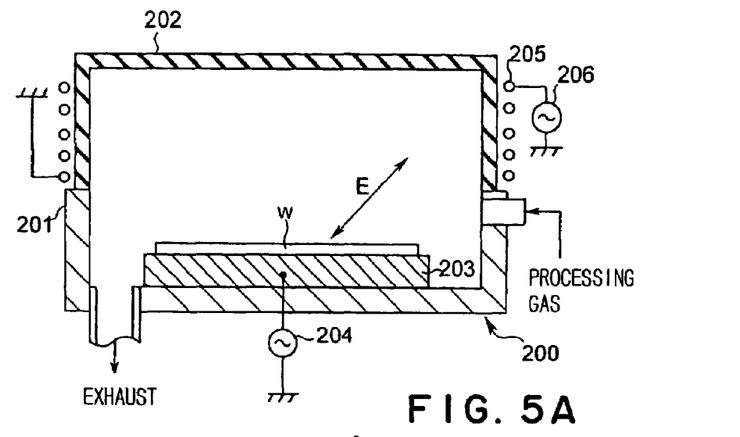
FIG. 5A is a diagrammatic sectional view of one example of the conventional plasma etching system using inductive coupled plasmas.

FIG. 5A is a sectional view of one example of the conventional plasma etching systems using the inductive coupled plasmas. The plasma etching system 200 comprises a chamber 201 having a susceptor 203 disposed inside for a wafer to be mounted on, a belljar 202 disposed on the chamber 201 with the interior communicated with the interior of the chamber 201, an antenna 205 wound on the outer periphery of the belljar 202, a high-frequency bias electric power source 204 connected to the susceptor 203, and a high-frequency electric power source 206 connected to the antenna 205. High-frequency electric power is supplied to the antenna 205 from the high-frequency electric power source 206, whereby induced electromagnetic fields are generated in the belljar 203 to generate plasmas of a processing gas. The wafer is processed with the plasmas.

Figure 5B:
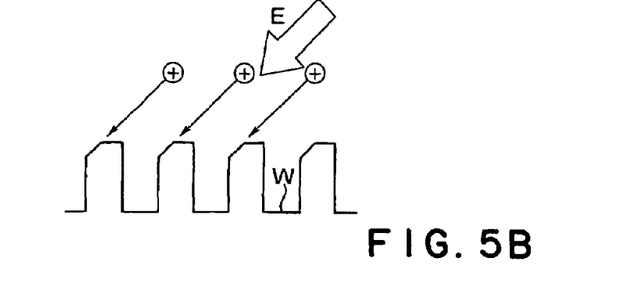
FIG. 5B is a view showing motions of an etchant of the conventional plasma etching system using the inductive couple plasmas.

However, in such plasma etching system 200, electric fields which are slant from the antenna 205 toward the susceptor 203 as indicated by the arrow in FIG. 5A, and the slant electric fields cause the etchant to be incident on the wafer surface as shown in FIG. 5B especially immediately after the plasmas are ignited. Resultantly, problems that configurations of micronized patterns are broken, and that electrons are slantly incident on the wafer surface, and charges are accumulated.

Figure 5C:
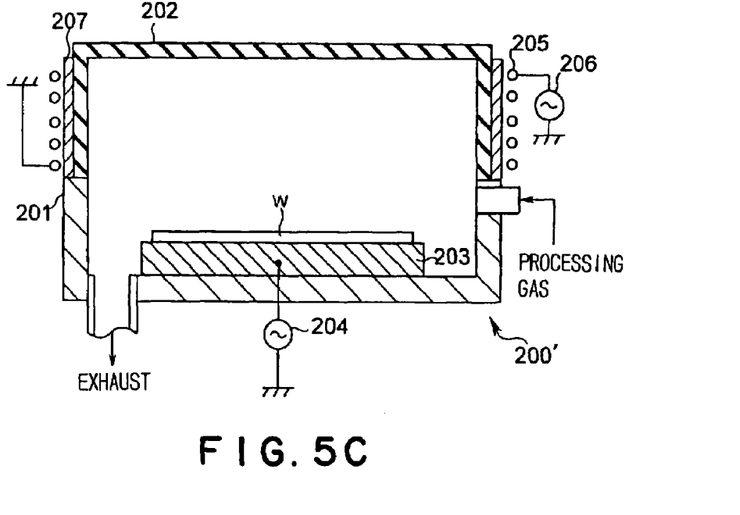
FIG. 5C is a diagrammatic sectional view of one example of the conventional plasma etching system using a Faraday shield.

As means for removing the slant electric fields which is a cause for such problems, Specification of Japanese Patent Application Unexamined Publication No. 1993-206072, for example, discloses the use of a Faraday shield. As exemplified in FIG. 5C, the Faraday shield 207 is a cylindrical member of a conductor disposed between the belljar 202 and the antenna 205 of the plasma etching system 200' and acts to short the components parallel with the axial direction of the Faraday shield 207 to remove the vertical components of the electric fields, whereby the generation of the slant electric fields is prevented. However, thus removing the vertical electric fields weakens the electric components effective to ignite the plasmas, which causes a problem of making the plasma ignition difficult.

In view of such circumferences, the present invention provides a plasma processing system and a plasma processing method which use inductive coupled plasmas and are free from the problems due to the slant electric fields generated immediately after plasmas have been ignited. An other object of the present invention is to provide a plasma processing system and a plasma processing method which can ignite the plasmas without failure even with the use of a Faraday shield in the conductive coupled plasma system.

SUMMARY OF THE INVENTION

To solve the above-described problems, according to one aspect of the present invention, the present invention provides a plasma processing system comprising a processing vessel including a housing unit for containing a substrate-to-be-processed and a plasma generating unit communicated with the housing unit and having an insulator wall, for performing plasma processing on the substrate-to-be-processed; a conducting mount disposed in the housing unit, for the substrate-to-be-processed to be mounted on; antenna means disposed on the outside of the insulator wall, for forming induced electromagnetic fields in the plasma generating unit; a first high-frequency electric power source for supplying high-frequency electric power to the antenna means; gas supply means for supplying a plasma generating gas which is dissociated by the induced electromagnetic fields generated by the antenna means, and a processing gas for the plasma processing; a conducting member disposed outside the insulator wall, opposed to the mount; and a second high-frequency electric source for supplying high-frequency electric power to the mount.

According to the aspect of the present invention, the present invention includes the conducting member disposed on the outside of the insulator wall, opposed to the mount, and the second high-frequency electric power source for supplying high-frequency electric power to the mount, whereby when plasmas are ignited, high-frequency electric power is supplied from the second high frequency electric power source to the mount to generate electric fields between the mount and the conducting member to thereby create a state where the electric fields generated between the mount and the conducting member dominant. Accordingly, the generation of the unpreferable influences due to electric fields generated slant to a substrate-to-be-processed can be suppressed.

According to a second aspect of the present invention, the present invention provides a plasma processing system comprising a chamber for housing a substrate-to-be processed; a belljar disposed on the chamber in communication with the chamber and having a side wall and a top wall of an insulator; a conducting mount disposed in the chamber, for the substrate-to-be-processed to be mounted on; an antenna means disposed on the outside of the side wall of the belljar, for generating induced electromagnetic fields in the belljar; a first high-frequency electric power source for supplying high-frequency electric power to the antenna means; gas supply means for supplying a plasma generating gas which is dissociated by the induced electromagnetic fields generated by the antenna means to be plasmas, and a processing gas for the plasma processing; a conducting member disposed upper of the top wall, opposed to the mount; and a second high-frequency electric power source for supplying high-frequency electric power to the mount.

According to the second aspect, the present invention includes the conducting member disposed upper of the top wall, opposed to the mount, and the second high-frequency electric power source for supplying high frequency electric power to the mount, whereby when plasmas are ignited, high frequency electric power is supplied from the second high-frequency electric power source to the mount to thereby generate electric fields vertical to a substrate-to-be-processed between the mount and the conducting member, whereby a state where electric fields vertical to the substrate-to-be-processed are dominant can be created. Accordingly the unpreferable influences due to the electric fields slant to the substrate-to-be-processed can be suppressed without failure.

Furthermore, according to a third aspect of the present invention, the present invention provides a plasma processing system comprising a chamber for housing a substrate-to-be-processed; a belljar disposed on the chamber in communication with the chamber and having a side wall and a top wall of an insulator; a conducting mount disposed in the chamber, for the substrate-to-be-processed to be mounted on; an antenna means disposed on the outside of the side wall of the belljar, for generating induced electromagnetic fields in the belljar; a first high-frequency electric power source for supplying high-frequency electric power to the antenna means; gas supply means for supplying a plasma generating gas which is dissociated by the induced electromagnetic fields generated by the antenna means to be plasmas, and a processing gas for the plasma processing; a Faraday shield disposed between the belljar and the antenna means; a conducting member disposed upper of the top wall, opposed to the mount; and a second high-frequency electric power source for supplying high-frequency electric power to the mount.

According to the third aspect, the present invention includes the Faraday shield disposed between the belljar and the antenna means, the conducting member disposed upper of the top wall, opposed to the mount, and the second high-frequency electric power source for supplying high frequency electric power to the mount, whereby when plasmas are ignited, high frequency electric power is supplied from the second high-frequency electric power source to the mount to generate electric fields vertical to a substrate-to-be-processed between the mount and the conducting member to thereby apply the electric fields required for the plasma ignition. Accordingly, the plasma ignition can be ensured while generation of the electric fields slant to the substrate-to-be-processed by using the Faraday shield can be avoided.

In the present invention according to any one of the first to the third aspects, preferably the mount includes a heating mechanism for heating the substrate-to-be-processed to thereby accelerate the reaction of the plasma processing.

According to a fourth aspect of the present invention, the present invention provides a plasma processing method for performing plasma processing by using a plasma processing system comprising a chamber for housing a substrate-to-be-processed; a belljar disposed on the chamber in communication with the chamber and having a side wall and a top wall of an insulator; a conducting mount disposed in the chamber, for the substrate-to-be-processed to be mounted on; an antenna means disposed on the outside of the side wall of the belljar, for generating induced electromagnetic fields in the belljar; a first high-frequency electric power source for supplying high-frequency electric power to the antenna means; gas supply means for supplying a plasma generating gas which is dissociated by the induced electromagnetic fields generated by the antenna means to be plasmas, and a processing gas for the plasma processing; a conducting member disposed upper of the top wall, opposed to the mount; and a second high-frequency electric power source for supplying high-frequency electric power to the mount, high-frequency electric power being supplied from the second high-frequency electric power source to the mount to generate electric fields vertical to the substrate-to-be-processed between the mount and the conducting member and generate plasmas, and then high-frequency electric power being supplied from the first high-frequency electric power source to the antenna means to generate induced electromagnetic fields in the belljar and generate inductive coupled plasmas, whereby the plasma processing is made on the substrate-to-be-processed.

According to the fourth aspect, in the present invention, high-frequency electric power is supplied from the second high frequency electric power source to the mount to generate electric fields vertical to a substrate-to-be-processed between the mount and the conducting member to thereby generate plasmas, then high frequency electric power is supplied from the first high-frequency electric power source to the antenna means to thereby generate induced electromagnetic fields in the belljar to generate inductive coupled plasmas in the belljar, whereby the plasma processing is made on the substrate-to-be-processed. This makes it possible to generate the electric fields vertical to a substrate-to-be-processed between the mount and the conducting member and generate the plasmas before the induced electromagnetic fields are generated, whereby the electric fields slant to a substrate-to-be-processed are prohibited from affecting a substrate-to-be-processed immediately after the plasma ignition, which is a problem in igniting plasmas by induced electromagnetic fields.

Furthermore, according to a fifth aspect of the present invention, the prevent invention provides a plasma processing method for performing plasma processing by using a plasma processing system comprising a chamber for housing a substrate-to-be-processed; a belljar disposed on the chamber in communication with the chamber and having a side wall and a top wall of an insulator; a conducting mount disposed in the chamber, for the substrate-to-be-processed to be mounted on; an antenna means disposed on the outside of the side wall of the belljar, for generating induced electromagnetic fields in the belljar; a first high-frequency electric power source for supplying high-frequency electric power to the antenna means; gas supply means for supplying a plasma generating gas which is dissociated by the induced electromagnetic fields generated by the antenna means to be plasmas, and a processing gas for the plasma processing; a Faraday shield disposed between the belljar and the antenna means; a conducting member disposed upper of the top wall, opposed to the mount; and a second high-frequency electric power source for supplying high-frequency electric power to the mount, high-frequency electric power being supplied from the second high-frequency electric power source to generate electric fields between the mount and the conducting member to ignite plasmas, and then, high-frequency electric power being supplied from the first high-frequency electric power source to the antenna means to generate induced electromagnetic fields in the belljar to generate inductive coupled plasmas, whereby the plasma processing is made on the substrate-to-be-processed.

According to the fifth aspect, high frequency electric power is supplied from the second high frequency electric source to the mount to generate electric field between the mount and the conducting member to ignite plasmas, and then high frequency electric source is supplied from the first high frequency electric power source to the antenna means to generate induced electromagnetic fields in the belljar to generate inductive coupled plasmas, whereby the plasma processing is made on a substrate-to-be-processed. The electric fields are generated between the mount and the conducting member before the induced electromagnetic fields are generated, whereby the electric fields required for the plasma ignition can be applied by the electric fields generated between the mount and the conducting member, whereby the plasma ignition can be ensured even in the inductive coupled plasma processing by using the Faraday shield which prevents the generation of the electric field slant to a substrate-to-be-processed.

According to the fourth or the fifth aspect, it is preferable that the first high frequency electric power source starts supplying high frequency electric power after the second high frequency electric power source has started supplying high frequency electric power, whereby plasmas are ignited by the electric fields generated by the high frequency electric power from the second high frequency electric power source, and after the plasma ignition, the plasma processing is made by the inductive coupled plasmas generated by the high frequency electric power from the first high frequency electric power source. In this case, it is preferable that the second high frequency electric power source stops supplying the high frequency electric power after the first high frequency electric power source has started supplying the high frequency electric power. This prevents the generation of high bias voltages in a substrate-to-be-processed.

In the above-described plasma processing method, it is preferable to make the plasma processing while a substrate-to-be-processed is being heated. This can accelerate the reaction of the plasma processing.

The above-described plasma processing method is suitably applicable to the processing for removing natural oxide films formed on a substrate-to-be-processed. In this case, as the plasma generating gas and the processing gas, argon gas and hydrogen gas are suitably used. In place of argon, inert gases, such as neon gas, helium gas, xenon gas, etc. can be used.

DESCRIPTION OF THE PREFERRED EMBODIMENTS

A first embodiment of the present invention will be explained below with reference to the drawings attached hereto.

Figure 1:
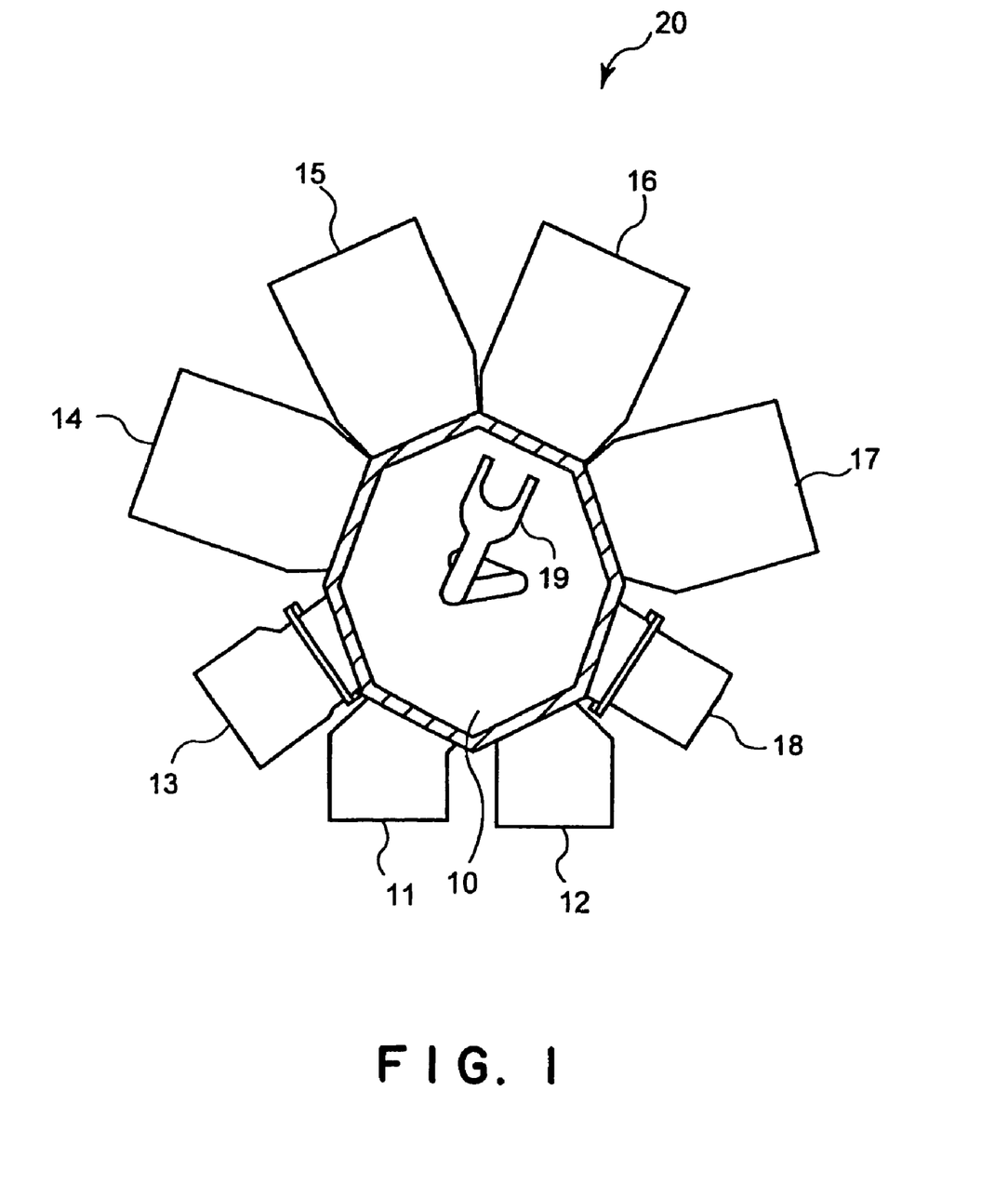
FIG. 1 is a block diagram of a metal deposition system including a pre-cleaning apparatus to which the plasma processing system according to a first embodiment of the present invention is applied.

FIG. 1 is a block diagram of a metal deposition system having a pre-cleaning apparatus to which the plasma processing system according to a first embodiment of the present invention is applied. The metal deposition system 20 is of the multi-chamber type comprising a transfer chamber 10 disposed at the center, and two cassette chambers 11, 12, a degassing chamber 13, a Ti film deposition apparatus 14, the pre-cleaning apparatus 15 the present embodiment relates to, TiN deposition apparatus 16, an Al deposition apparatus 17 (a tungsten (W) deposition apparatus in a case that metal layers of tungsten (W) are deposited, but in the present embodiment, the Al deposition apparatus 17 is exemplified), and a cooling chamber 18, which are arranged around the transfer chamber 10.

In this metal deposition system 20, a barrier layer is formed on a semiconductor wafer (herein after simply called a wafer W) with contact holes or via holes formed in, and an Al (aluminium) layer is formed on the barrier layer to fill the holes and form the Al interconnection. Specifically, one sheet of wafer W is taken out of the cassette chamber 11 by a carrier arm 19 to be loaded into the pre-cleaning apparatus 15 and have natural oxide films formed on the surface of the wafer W removed. Then, the wafer W is loaded into the degassing chamber 13 to be degassed. Then, the wafer W is loaded into the Ti deposition apparatus 14 to have a Ti film deposited on, then further loaded into the TiN deposition apparatus 16 to have a TiN film deposited as a barrier layer. Then, in the Al deposition apparatus 17, an Al layer is deposited on the wafer W. The prescribed deposition processing is completed here, and then the wafer W is cooled in the cooling chamber 18 and loaded into the cassette chamber 12.

Thus, a device including, for example, on a wafer having an inter-layer insulation film with contact holes formed in down to dopant diffused regions, a barrier layer formed in the dopant diffused regions and on the inter-layer insulation film, and a metal layer formed on the barrier layer and connected to the dopant diffused regions is fabricated.

Figure 2:
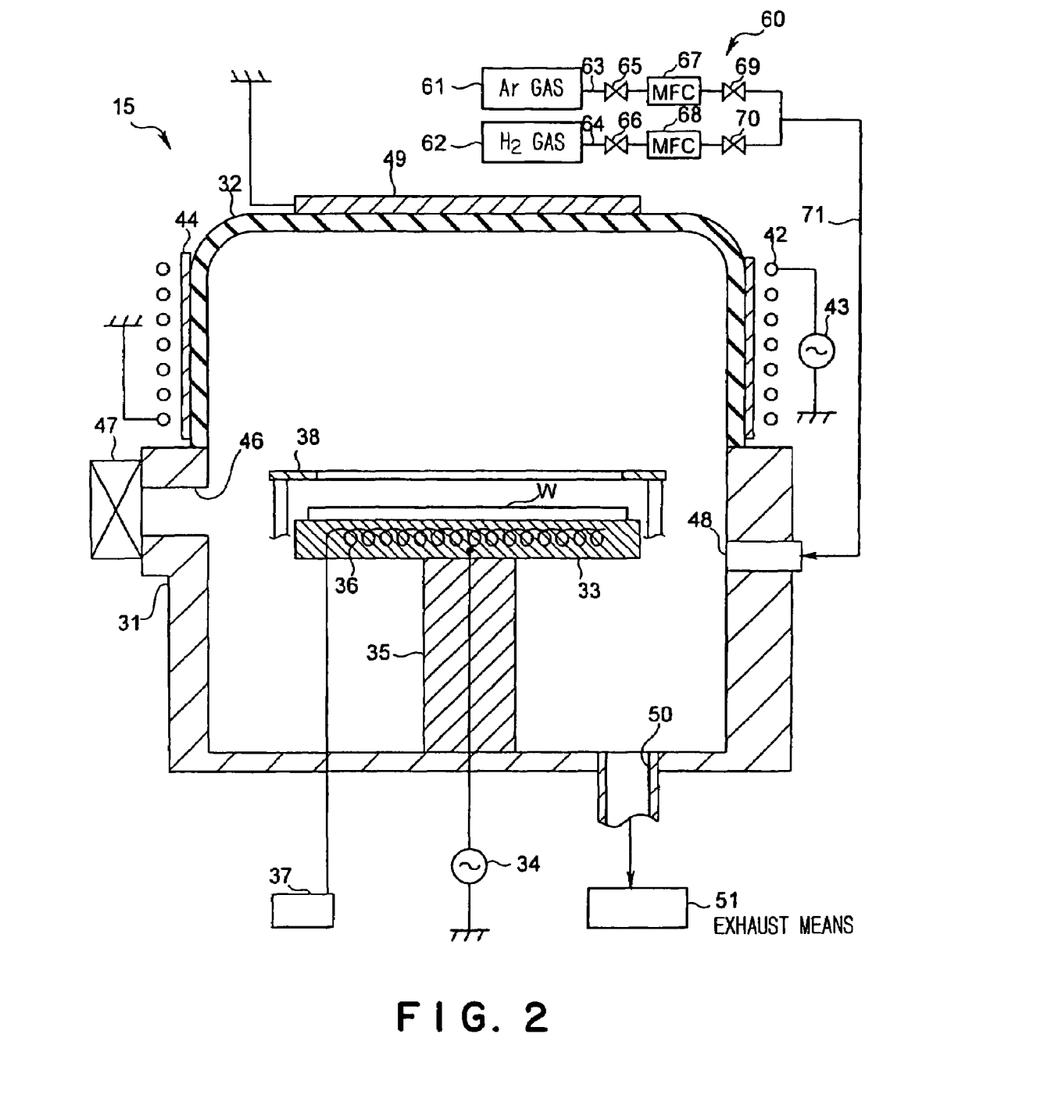
FIG. 2 is a diagrammatic sectional view of the plasma processing system according to the first embodiment of the present invention.

Then, the pre-cleaning apparatus 15 according to the present embodiment mounted on the metal deposition system 20 will be detailed below. As shown in FIG. 2, the pre-cleaning apparatus 15 comprises a substantially cylindrical chamber 31 and a substantially cylindrical belljar 32 continuously disposed on the chamber 31. In the chamber 31, a susceptor (mount) 33 of a conducting material for horizontally supporting a wafer W, an object-to-be-processed is arranged, supported by a cylindrical support member 35. A conducting member 49 of a conducting material is disposed upper of the belljar 32, opposed to the susceptor 33.

The conducting member 49 is formed of a metal of high conductivity, e.g., Al (aluminium) and is a disc (at least the surface opposed to the belljar 32 is flat) having substantially the same diameter as that of a wafer or the susceptor 33 and a 1-5 mm thickness. The conducting member 49 is disposed upper of the belljar 32, opposed to the susceptor 33. The conducting member 49 may be mounted on the belljar 32 but may be disposed, a little spaced from the top surface of the belljar.

The conducting member 49 is grounded to GND to thereby generate electric fields vertical to the susceptor 33 between the conducting member 49 and the susceptor 33. Also, as seen in the illustrated embodiment the grounded conducting member 49 is arranged within the plasma processing system to be permanently and at all times free from a direct electrical connector with a high-frequency electric power source.

The susceptor 33 is connected to a second high-frequency electric power source 34, and the second high-frequency electric power source 34 supplies high-frequency electric power to the susceptor 33 to generate electric fields vertical to the wafer W between the susceptor 33 and the conducting member 49. A heater 36 is buried in the susceptor 33, and an electric power source 37 supplies electric power to the heater 36 to heat the wafer to a prescribed temperature.

Figure 3:
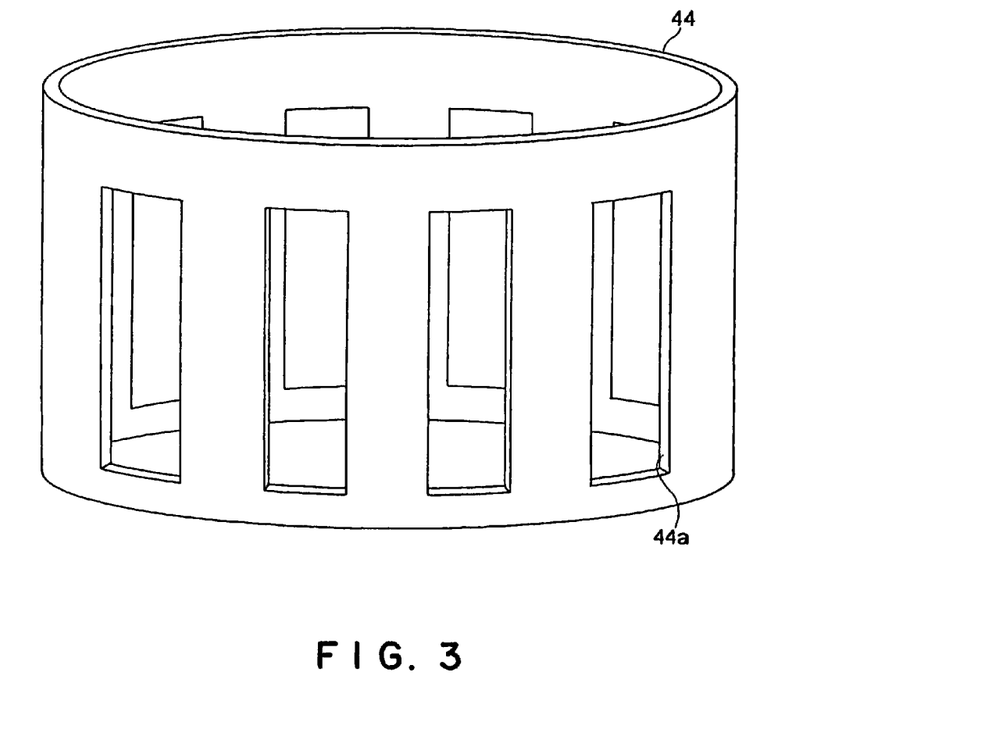
FIG. 3 is a perspective view of the Faraday shield of the pre-cleaning apparatus shown in FIG. 2.

The belljar 32 is formed of an electrically insulating material, e.g., quartz, ceramics or others, and a substantially cylindrical Faraday shield 44 having slits 44a longitudinally opened at a prescribed pitch is disposed around the belljar 32. A coil 42 as an antenna member is wound around the outer periphery of the Faraday shield 44. The coil 42 is connected to a first high-frequency electric power source 43 of, e.g., 450 kHz, and the first high-frequency electric power source 43 supplies high-frequency electric power to the coil 42 to generate induced electromagnetic fields in the belljar 32. The Faraday shield 44 functions to prevent the generation of electric fields which are slant from the coil 42 toward the susceptor 33.

A clamp ring 38 which can press the wafer W mounted on the susceptor 33, clamping the outer edge of the wafer W is disposed upper of the susceptor 33 and can be moved up and down by a lift mechanism not shown. The clamp ring 38 is moved up to a prescribed position when a wafer W is carried into the chamber 31 and transferred onto the support pins (not shown) provided on the susceptor 33, and when the wafer is mounted on the susceptor 33 by withdrawing the support pins (not shown) to be held, the clamp ring 38 is moved down to a position where the clamp ring 38 clamps the wafer in contact with the outer edge of the wafer W.

The chamber 31 has an opening 46 in the side wall. A gate valve 47 is provided on the outside of the chamber 31 at the position opposed to the opening 46. With the gate valve 47 opened, a wafer W is carried between a load-lock chamber (not shown) and the chamber 31 communicated with each other. A gas supply nozzle 48 is provided in the side wall of the chamber 31, and the gas supply nozzle 48 feeds gases from a gas supply mechanism 60 into the chamber 31 and the belljar 32.

The gas supply mechanism 60 has an Ar gas supply source 61 which supplies Ar gas as a plasma generating gas and an $H_2$ gas supply source 62 which supplies $H_2$ gas as a processing gas for etching. The Ar gas supply source 61 is connected to a gas line 63. A mass flow controller 67 is inserted in the gas line 63, and opening/closing valves 65, 69 are inserted before and after the mass flow controller 67. The $H_2$ gas supply source 62 is connected to a gas line 64. A mass flow controller 68 is inserted in the gas line 64, and opening/closing valves 66, 70 are inserted before and after the mass flow controller 68. The gas lines 63, 64 are connected to a gas line 71. The gas line 71 is connected to the gas supply nozzle 48.

An exhaust pipe 50 is connected to the bottom wall of the chamber 31. The exhaust pipe 50 is connected to exhaust means 51 including a vacuum pump. The exhaust means 51 is operated to thereby maintain a prescribed vacuum degree in the chamber 31 and the belljar 32.

Then, the operation of removing natural oxide films formed on a wafer W by the pre-cleaning apparatus 15 of the above-described structure will be explained.

First, the gate valve 47 is opened, and a wafer W is carried into the chamber 31 by the carrier arm 19 disposed in the carrier chamber 10 and transferred onto the support pins (not shown) of the susceptor 33. Next, the support pins are withdrawn into the susceptor 33 to thereby mount the wafer on the susceptor 33, and then the clamp ring 38 is lowered to clamp the wafer W at the outer edge thereof. Next, the gate valve 47 is closed, and the interior of the chamber 31 and the belljar 32 is exhausted by the exhaust means 51 to be place under a prescribed decreased pressure. Under the decreased pressure, the Ar gas is fed at a prescribed flow rate from the Ar gas supply source 61 into the chamber 31 and the belljar 32 while high-frequency electric power is supplied from the second high-frequency electric power source 34 to the susceptor 33 to thereby generate, between the susceptor 33 and the conducting member 48, electric fields which are vertical to the wafer W. The Ar gas is excited by the electric fields to ignite plasmas.

After the plasma ignition, the supply of high-frequency electric power from the first high-frequency electric power source 43 to the coil 42 is started to generate induced electromagnetic fields in the belljar 32 while the supply of the high-frequency electric power from the second high-frequency electric power source 34 to the susceptor 33 is stopped. Hereafter the plasmas are retained by the induced electromagnetic fields. If necessary, the supply of the high-frequency electric power from the second high-frequency electric power source may be retained after the start of the supply of the high-frequency electric power from the first high-frequency electric power source 43. In this state, with the flow rate of the Ar gas from the Ar gas supply source 61 decreased, the supply of the $H_2$ gas from the $H_2$ gas supply source 62 into the chamber 31 is started, and the processing for etching off natural oxide films on the wafer W is performed while the wafer W is being heated by the heater 36. At this time, the Faraday shield 44 prohibits the coil 42 from generating electric fields slant to the surface of the wafer W, whereby the breakage of a pattern configuration on the surface of the wafer W and the charge accumulation in the wafer W due to the incidence of the ions and electrons on the surface of the wafer W can be prevented. Inductive coupled plasmas, whose bias voltage is intrinsically low, cause little damage.

The natural oxide films on the wafer W are thus removed, and then, a displacement of the exhaust means 51, an Ar gas flow rate from the Ar gas supply source 61 and an $H_2$ gas flow rate from the $H_2$ gas supply source 62 are adjusted to make a vacuum degree in the chamber 31 and the belljar 32 equal to that in the carrier chamber 10 while the support pins are projected out of the susceptor 33 to lift the wafer W, and the gate valve 47 is opened to advance the carrier arm 19 into the chamber 31 to take out the wafer W. The step in the pre-cleaning apparatus 15 is thus completed.

As conditions for this process, for example, the electric power of the first high-frequency electric power source 43 can be 500-1000 W, and the frequency is 450 kHz, the electric power of the second high-frequency electric power source 34 is 500-1000 W, and the frequency is 13.56 MHz, the heating temperature of the heater 36 can be 50-500° C., and the pressure in the chamber 31 can be 0.133-13.3 Pa (0.1-100 mTorr). The Ar gas can be supplied at a suitable flow rate of a range of 0-0.050 L/min (0-50 sccm), and the $H_2$ gas can be supplied at a suitable flow rate of a range of 0-0.200 L/min (0-200 sccm). In more details, the Ar gas flow rate at the time of the ignition can be 0.050 L/min (50 sccm), and the Ar gas flow rate/$H_2$ gas flow rate at the time of the processing can be 0.008/0.012 L/min(8/12 sccm).

The above-described plasma processing can suitably remove natural oxide films on, e.g., Si, CoSi, W, WSi and TiSi. In the conventional plasma processing system of the inductive coupled plasma type, removing electric fields slant from the coil 42 toward the susceptor 33 by using the Faraday shield 44 weakens the electric fields, which disadvantageously makes it difficult to ignite the plasmas. However, the above-described structure ensures the ignition of the plasmas by the electric field generated between the susceptor 33 and the conducting member 49, and the plasma ignition can be followed by the step of the pre-cleaning using the inductive coupled plasmas generated by the induced electric electromagnetic fields.

Such use of the inductive coupled plasmas can assist the plasmas with the magnetic filed components, whereby the ratio of the $H_2$ can be increased while the ratio of the Ar can be decreased. Furthermore, the plasma density and the bias voltage can be controlled independently of each other, which permits the bias voltage to be low while permitting the plasma density to be high. These can make the removal of the natural oxide films very efficient. The capacitive coupled plasmas are not stable, which does not permit to decrease the Ar, and the plasma density and the bias voltage cannot be controlled independently of each other. The capacitive coupled plasmas cannot remove natural oxide film so efficiently.

Then, a second embodiment of the present invention will be explained.

Figure 4:
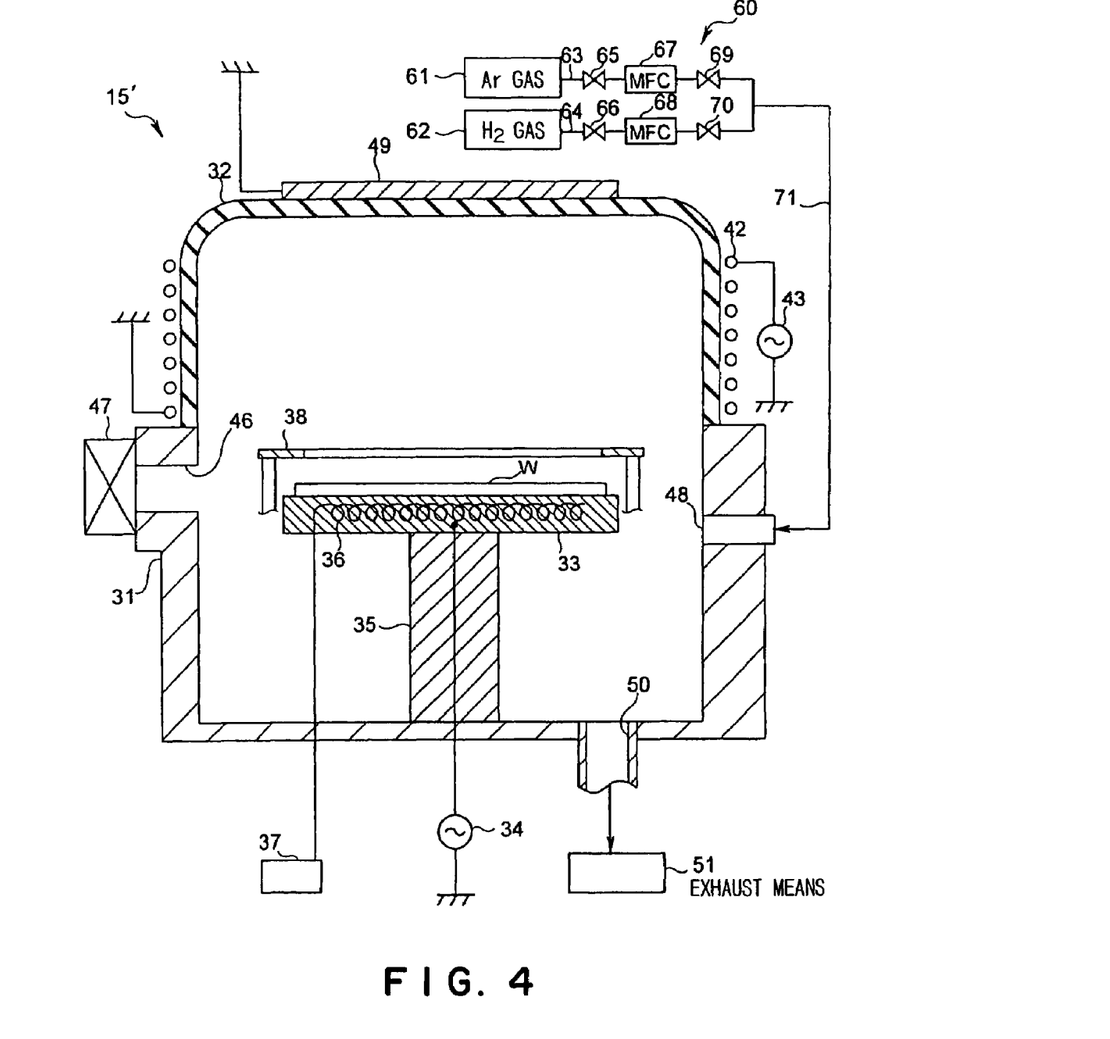
FIG. 4 is a diagrammatic sectional view of the pre-cleaning apparatus according to a second embodiment of the present invention.

FIG. 4 is a sectional view of a pre-cleaning apparatus the plasma processing system according to the present embodiment is applied to. The pre-cleaning apparatus 15' has the same structure as the pre-cleaning apparatus 15 according to the first embodiment except that in the former the Faraday shield 44 is not provided. Such pre-cleaning apparatus 15' performs the processing operation for removing natural oxide films formed on a wafer W that, as is done in the pre-cleaning apparatus 15 according to the first embodiment, high-frequency electric power is supplied from the second high-frequency electric power source 34 to the susceptor 33 to ignite plasmas, and then high-frequency electric power is supplied from the first high-frequency electric power source 43 to the coil 42 to generate inductive coupled plasmas to remove the natural oxide films formed on the wafer W.

In the present embodiment, when the plasmas are ignited, as described above, the high-frequency electric power is supplied from the second high-frequency electric power source 34 to the susceptor 33 prior to the supply of the high-frequency electric power source from the first high-frequency electric power source 43, so as to generate electric fields vertical to a wafer W between the susceptor 33 and the conducting member 49, whereby the state where the electric fields vertical to the wafer W are dominant can be created. Accordingly, the state where slant electric fields which tend to cause the deterioration of a surface state of a wafer W, and disadvantages of charge accumulation, etc. due to the slant electric fields are not generated, whereby the deterioration of a surface state of a wafer W and influences of charge accumulation, etc. can be reduced. After the plasmas have been thus ignited, the high-frequency electric power is supplied from the first high-frequency electric power source 43 to the coil 42, whereby the plasma processing can be performed with the inductive coupled plasmas highly efficiently and with little damage, as is done in the first embodiment.

The present invention is not limited to the above-described embodiments and can cover other various modifications. In the above-described embodiment, the present invention is applied to the pre-cleaning apparatus of the metal deposition system, which removes natural oxide films but is applicable to, e.g., other plasma etching systems which perform contact etching, etc. Furthermore, the present invention is applicable to plasma etching systems for plasma CVD, etc. This plasma processing system may comprise a conventional inductive coupled plasma processing system having a grounded conductor plate mounted on the belljar. Making simple reforms as described above on the conventional system can make the system cost of the present invention very low. Furthermore, the substrates to be processed are not essentially semiconductor wafers and can be other substrates.

As described above, according to the present invention the conduction member is disposed on the outside of the insulator wall, and the second high-frequency electric power source for supplying high-frequency electric power to the mount are provided, whereby when plasmas are ignited, high-frequency electric power is supplied from the second high-frequency electric power source to the mount to generate electric fields between the mount and the conducting member to thereby make the electric fields generated between the mount and the conducting member dominant in the processing chamber so as to suppress unpreferable influences caused by the electric fields generated slant to a substrate-to-be-processed.

According to the present invention, the conducting member is provided upper of the top wall, opposed to the mount, and the second high-frequency electric power source for supplying high-frequency electric power to the mount, whereby when plasmas are ignited, high-frequency electric power is supplied from the second high-frequency electric power source to the mount to generate electric fields vertical to a substrate-to-be-processed between the mount and the conducting member, whereby the state where electric fields vertical to the substrate-to-be-processed are dominant is created to thereby suppress without failure the unpreferable influences caused by the electric fields generated slant to the substrate-to-be-processed. Thus, a plasma processing system and a plasma processing method which can perform processing of high precision and efficiency can be provided.

Furthermore, according to the present invention, the Faraday shield is provided between the belljar and the antenna, the conducting member is disposed opposed to the mount, upper of the mount, the second high-frequency electric power source for supplying high-frequency electric power to the mount is provided, and when plasmas are ignited, high-frequency electric power is supplied from the second high-frequency electric power source to the mount to generate electric fields vertical to a substrate-to-be-processed between the mount and the conducting member to thereby generate the electric fields necessary to ignite the plasma. Accordingly, while the generation of the electric fields slant to a substrate-to-be-processed is prevented by the Faraday shield, the plasma ignition can be ensured. Thus, a plasma processing system and a plasma processing method which has solved the problem that makes it difficult to ignite the plasma in the inductive coupled plasma system using the Faraday shield can be realized.

What is claimed is:

1. A plasma processing method for performing plasma processing by using a plasma processing system comprising a chamber for housing a substrate-to-be-processed; a belljar disposed on the chamber in communication with the chamber and having a side wall and a top wall of an insulator; a conducting mount disposed in the chamber, for the substrate-to-be-processed to be mounted on; an antenna means disposed on the outside of the side wall of the belljar, for generating induced electromagnetic fields in the belljar; a first high-frequency electric power source for supplying high-frequency electric power to the antenna means; gas supply means for supplying a plasma generating gas which is dissociated by the induced electromagnetic fields generated by the antenna means to be plasmas, and a processing gas for the plasma processing; a conducting member disposed upper of the top wall, opposed to the mount, and being permanently grounded; and a second high-frequency electric power source for supplying high-frequency electric power to the mount, high-frequency electric power being supplied from the second high-frequency electric power source to the mount to generate electric fields between the mount and the conducting member and to ignite plasmas based on only the high frequency power from said mount to said grounded conducting member, after ignition is achieved with said second high-frequency electric power source, high-frequency electric power being supplied from the first high-frequency electric power source to the antenna means is initiated to generate induced electromagnetic fields in the belljar and generate inductive coupled plasmas, and then, the second high-frequency electric power source being stopped from supplying high-frequency electric power to the mount after the first high-frequency electric power source has started the supply of the high-frequency electric power to the antenna means so that high-frequency electric power is supplied only to the antenna means, whereby the plasma processing is made on the substrate-to-be-processed, and wherein the plasma processing is carried out at a process chamber pressure of 0.1 to 100 mTorr.

2. A plasma processing method according to claim 1, wherein
the plasma processing is performed while the substrate-to-be-processed is being heated.

3. A plasma processing method according to claim 2, wherein
the plasma processing is for removing natural oxide films formed on the substrate-to-be-processed.

4. A plasma processing method according to claim 3, wherein
the plasma generating gas and the processing gas are argon gas and hydrogen gas.

5. A plasma processing method according to claim 4, wherein the first high-frequency electric power source is connected to an upper end portion of the antenna means.

6. A plasma processing method according to claim 4, wherein the hydrogen gas supply is started while the argon gas supply is decreased.

7. A plasma processing method according to claim 1, wherein after the induced electromagnetic fields are generated, said second high-frequency electric power source is shut down.

8. A plasma processing method according to claim 1, wherein said conducting member has a surface which opposes said belljar that is a flat surface.

9. A plasma processing method according to claim 8 wherein said conducting member is a flat disc object.

10. A plasma processing method according to claim 1 wherein said grounded conducting member is not directly electrically coupled to a high-frequency electric power source.

11. A plasma processing method according to claim 1, wherein the supply of high-frequency electric power from the first high frequency electric power source to the antenna means is started while the supply of high frequency electric power from the second high-frequency electric power source to the mount is stopped.

12. A plasma processing method according to claim 1, wherein upon the supply of second high-frequency electric power being stopped there is avoided capacitive coupling activity between, and based on, said mount and conducting member.

13. A plasma processing method for performing plasma processing by using a plasma processing system comprising a chamber for housing a substrate-to-be-processed; a belljar disposed on the chamber in communication with the chamber and having a side wall and a top wall of an insulator; a conducting mount disposed in the chamber, for the substrate-to-be-processed to be mounted on; an antenna means disposed on the outside of the side wall of the belljar, for generating induced electromagnetic fields in the belljar; a first high-frequency electric power source for supplying high-frequency electric power to the antenna means; gas supply means for supplying a plasma generating gas which is dissociated by the induced electromagnetic fields generated by the antenna means to be plasmas, and a processing gas for the plasma processing; a Faraday shield disposed between the belljar and the antenna means; a conducting member disposed upper of the top wall, opposed to the mount, and being permanently grounded; and a second high-frequency electric power source for supplying high-frequency electric power to the mount, high-frequency electric power being supplied from the second high-frequency electric power source to the mount to generate electric fields between the mount and the conducting member and to ignite plasmas based on only the high frequency power from said mount to said grounded conducting member, after ignition is achieved with said second high-frequency electric power source, high-frequency electric power being supplied form the first high-frequency electric power source to the antenna means is initiated to generate induced electromagnetic fields in the belljar to generate inductive coupled plasmas, and then, the second high-frequency electric power source being stopped from supplying high-frequency electric power to the mount after the first high-frequency electric power source has started the supply of the high-frequency electric power to the antenna means so that high-frequency electric power is supplied only to the antenna means, whereby the plasma processing is made on the substrate-to-be-processed, and wherein the plasma processing is carried out at a process chamber pressure of 0.1 to 100 mTorr.

14. A plasma processing method according to claim 13, wherein the plasma processing is performed while the substrate-to-be-processed is being heated.

15. A plasma processing method according to claim 14, wherein the plasma processing is for removing natural oxide films formed on the substrate-to-be-processed.

16. A plasma processing method according to claim 15, wherein the plasma generating gas and the processing gas are argon gas and hydrogen gas.

17. A plasma processing method according to claim 16, wherein the first high-frequency electric power source is connected to an upper end portion of the antenna means.

18. A plasma processing method according to claim 13, wherein after the induced electromagnetic fields are generated, said second high-frequency electric power source is shut down.

19. A plasma processing method according to claim 13, wherein said conducting member has a surface which opposes said belljar that is a flat surface.

20. A plasma processing method according to claim 19 wherein said conducting member is a flat disc object.

21. A plasma processing method according to claim 6 wherein said grounded conducting member is not directly electrically coupled to a high-frequency electric power source.

22. A plasma processing method according to claim 13, wherein upon the supply of second high-frequency electric power being stopped there is avoided capacitive coupling activity between, and based on, said mount and conducting member.

23. A plasma processing method for performing plasma processing by using a plasma processing system comprising a chamber for housing a substrate-to-be-processed; a belljar disposed on the chamber in communication with the chamber and having a side wall and an insulator top wall; a conducting mount disposed in the chamber, for the substrate-to-be-processed to be mounted on; an antenna means disposed on the outside of the side wall of the belljar, for generating induced electromagnetic fields in the belljar; a first high-frequency electric power source for supplying high-frequency electric power to the antenna means; gas supply means for supplying a plasma generating gas which is dissociated by the induced electromagnetic fields generated by the antenna means to be plasmas, and a processing gas for the plasma processing; a conducting member that is opposed to said mount and disposed external to said belljar upper of the insulator top wall, said conducting member being grounded; and a second high-frequency electric power source for supplying high-frequency electric power to the mount, high-frequency electric power being supplied from the second high-frequency electric power source to the mount to generate electric fields extending vertically from the mount toward the grounded conducting member and to ignite plasmas based on the high frequency power provided to said mount, and said grounded conducting member being arranged within the plasma processing system so as to be permanently and at all times free from direct electrical connection with a high-frequency electric power source, and then, after ignition is achieved with said second high-frequency electric power source, high-frequency electric power being supplied from the first high-frequency electric power source to the antenna means is initiated to generate induced electromagnetic fields in the belljar and generate inductive coupled plasmas, whereby the plasma processing is made on the substrate-to-be-processed, and wherein the plasma processing is carried out at a process chamber pressure of 0.1 to 100 mTorr.

24. A plasma processing method according to claim 23, wherein the supply of high-frequency electric power from the first high frequency electric power source to the antenna means is started to generate induced electromagnetic fields in the belljar while the supply of high frequency electric power from the second high-frequency electric power source to the mount is stopped.

25. A plasma processing method according to claim 23, wherein plasma ignition is based on only high-frequency electric power generated by said second high-frequency electric power source, and wherein the second high-frequency electric power source stops supplying high-frequency electric power to the mount after the first high-frequency electric power source has started the supply of the high-frequency electric power to the antenna means so that high-frequency electric power is supplied thereafter only to the antenna means.

26. A plasma processing method according to claim 24, wherein upon the supply of second high-frequency electric power being stopped there is avoided capacitive coupling activity between, and based on, said mount and conducting member.

* * * * *